US007568280B2

(12) United States Patent
Zeng et al.

(10) Patent No.: US 7,568,280 B2
(45) Date of Patent: Aug. 4, 2009

(54) PACKAGE REMOVAL DEVICE

(75) Inventors: Zhao-Lue Zeng, Shenzhen (CN); Hsuan-Jen Kung, Tu-Cheng (TW); Jin-Yue Kang, Shenzhen (CN); Yuan-Chiu Lin, Tu-Cheng (TW)

(73) Assignees: Hong Fu Jin Preicision Industry (Shen Zhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 562 days.

(21) Appl. No.: 11/316,009

(22) Filed: Dec. 21, 2005

(65) Prior Publication Data

US 2006/0142133 A1 Jun. 29, 2006

(30) Foreign Application Priority Data

Dec. 24, 2004 (CN) .................... 2004 2 0103467 U

(51) Int. Cl.
*H01R 43/00* (2006.01)

(52) U.S. Cl. ............................ 29/739; 29/740; 29/762; 29/426.3; 414/811

(58) Field of Classification Search ........... 29/740–743, 29/809, 729, 739, 732–737; 206/316.1, 723; 414/416.01, 412, 416.06, 811; 221/211, 221/285, 306; 226/120, 162, 681
See application file for complete search history.

(56) References Cited

U.S. PATENT DOCUMENTS

| | | | | |
|---|---|---|---|---|
| 5,713,125 | A * | 2/1998 | Watanabe et al. | 29/833 |
| 6,026,885 | A * | 2/2000 | Mogi et al. | 156/584 |
| 6,077,022 | A * | 6/2000 | Gfeller et al. | 414/416.01 |
| 6,178,620 | B1 * | 1/2001 | Yoshida et al. | 29/740 |
| 6,368,045 | B1 * | 4/2002 | Ashman et al. | 414/411 |
| 6,402,452 | B1 * | 6/2002 | Miller et al. | 414/412 |
| 6,694,606 | B1 * | 2/2004 | Ohashi et al. | 29/740 |
| 6,923,878 | B2 * | 8/2005 | Davis et al. | 156/64 |

FOREIGN PATENT DOCUMENTS

| | | |
|---|---|---|
| JP | 9-64586 | 3/1997 |

* cited by examiner

*Primary Examiner*—Minh Trinh

(57) ABSTRACT

A package removal device is for removing a package (5) from a component band (1) to expose a carrier band (2). The package removal device includes a stand (10), a first scrolling unit includes a first gear (52), and a second scrolling unit includes a second gear (85). The stand includes a platform (12) with an import end (**14*a*) and an export end (14*b*). The export end includes a locating gear (18) mounted thereon, a first exit (24), and a second exit (22**). The component band is separated into the package and the carrier band in the export end. The first gear meshes with the second gear to output the package from the first exit. The locating gear engages the carrier band to output the carrier band from the second exit.

10 Claims, 7 Drawing Sheets

PACKAGE REMOVAL DEVICE

BACKGROUND

1. Field of the Invention

The present invention relates to removal devices, and particularly to a removal device which can efficiently remove a package from a component band.

2. General Background

Conventionally, there are a lot of electronic components arranged on a circuit board to form a circuit with a certain function, such as capacitors, resistors, and inductors. As showing in FIG. 1, a component band 1 fixed with above mentioning electronic components often is used during the assembly of the circuit board. The component band 1 includes a carrier band 2, and a package 5 attached on the carrier band 2. The carrier band 1 defines a lot of dents 3, and a lot of apertures 6 therein. Each dent 3 accommodates with an electronic component 4 therein. The package 5 is configured to prevent the components 4 from damaging. Before assembly, the package 5 must be removed by some tools to expose the components 4 on the carrier band 2 for easily being picked up. Japan Patent No. 9-64586 discloses a package removal device. The package removal device includes a conveyor band, and a collecting wheel. The component band moves through the package removal device, and the package winds around the collecting reel to be stripped from the component band. However, when many of the packages wind around the collected reel, the machine must stop to take down the collecting wheel for cleaning the packages. This is inconvenient and costly during the whole assembly process.

What is desired, therefore, is a package removal device which can efficiently remove a package from a component band.

SUMMARY

An exemplary of the package removal device is for removing a package from a component band to expose a carrier band. The package removal device includes a stand, a first scrolling unit includes a first gear, and a second scrolling unit includes a second gear. The stand includes a platform with an import end and an export end. The export end includes a locating gear mounted thereon, a first exit, and a second exit. The component band is separated into the package and the carrier band in the export end. The first gear meshes with the second gear to output the package from the first exit. The locating gear engages the carrier band to output the carrier band from the second exit.

Other advantage and novel feature will become more apparent from the following detailed description when taken in conjunction with the accompanying drawings, in which:

DETAILED DESCRIPTION OF THE EMBODIMENT

Figure 1:
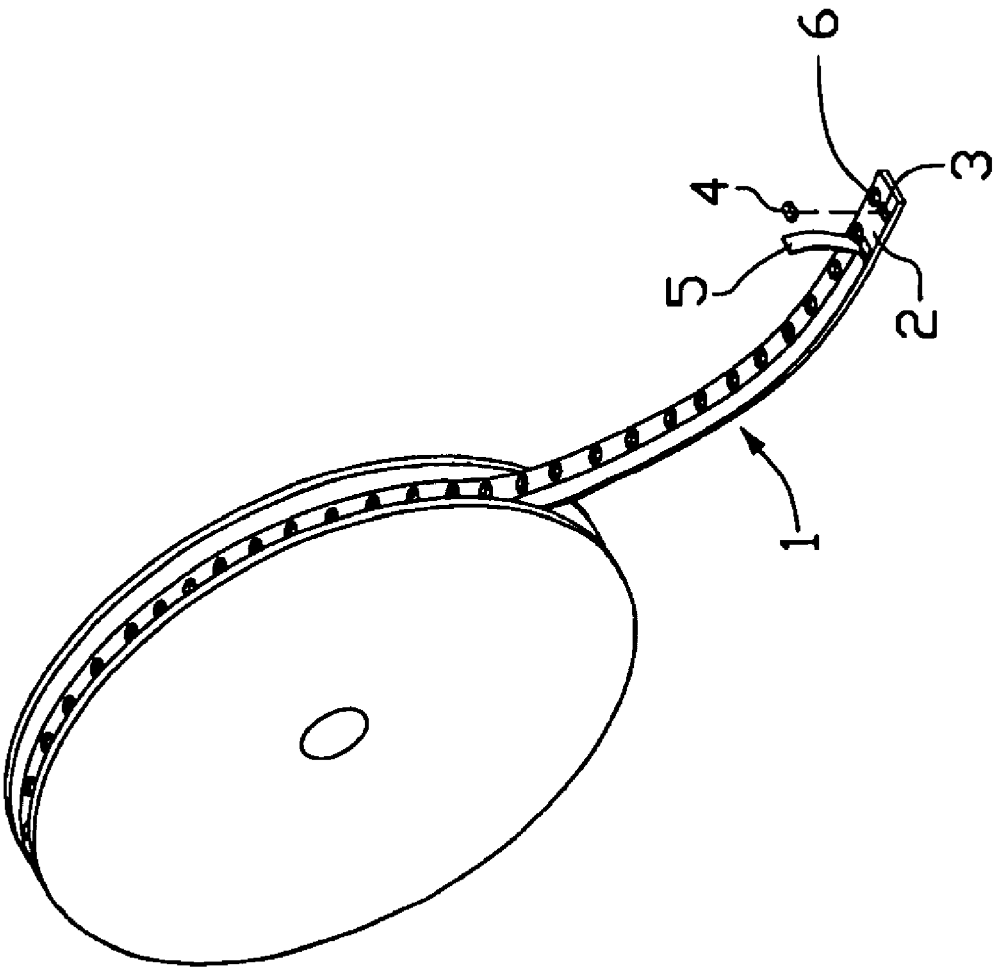
FIG. 1 is an isometric view of a conventional component band of related art.
Figure 2:
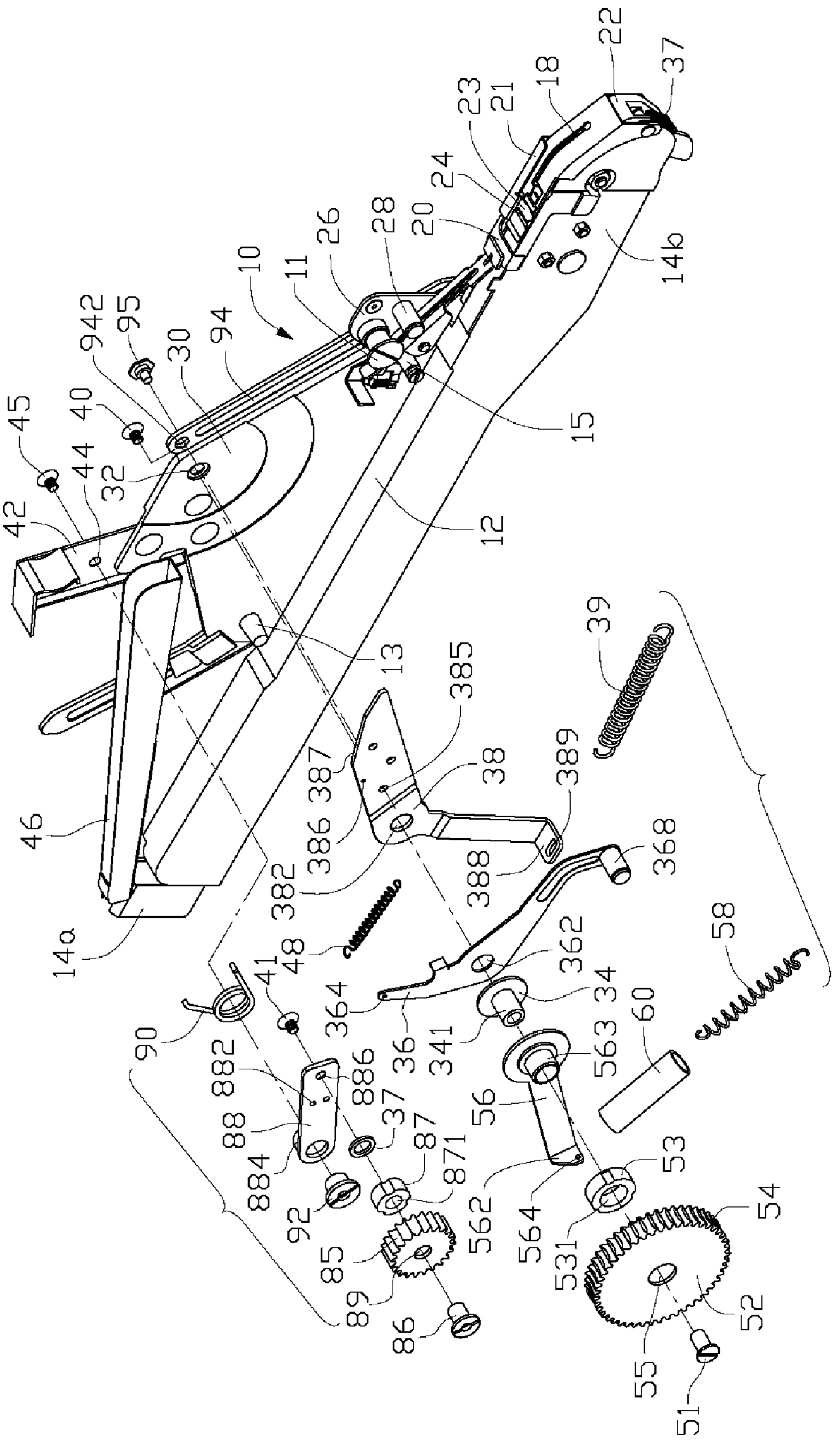
FIG. 2 is an exploded, isometric view of a package removal device in accordance with a preferred embodiment of the present invention.
Figure 3:
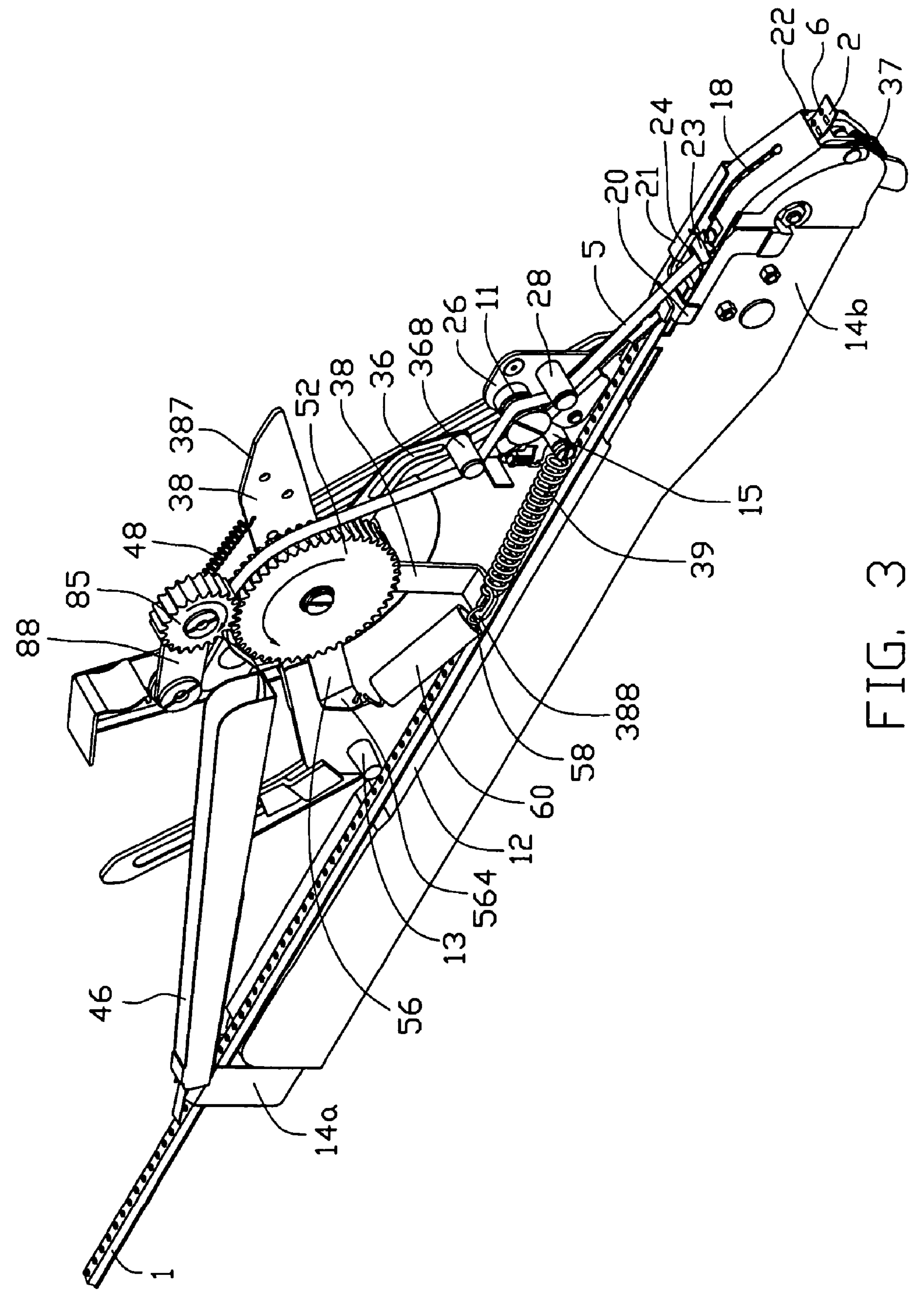
FIG. 3 is an assembled view of FIG. 2, showing a force applied on the package removal device.

Referring to FIGS. 2 to 3, a package removal device to provide components for further processing in accordance with a preferred embodiment of the present invention is shown for stripping a package 5 from a conventional component band 1 to expose electronic components 4 (see FIG. 4) thereon. The package removal device includes a stand 10, a first scrolling unit, and a second scrolling unit.

Referring also to FIG. 2, the stand 10 includes a platform 12, a main mounting board 30 extending upwardly from an edge portion of the platform 12, a first mounting board 42 perpendicular to the main mounting board 30, a second mounting board 26 parallel to the main mounting board 30, a U-shaped ditch 46 slantingly disposed between the platform 12 and the main mounting board 30, and a crank bar 94. The ditch 46 provides a transport passage for the package 5.

Figure 4:
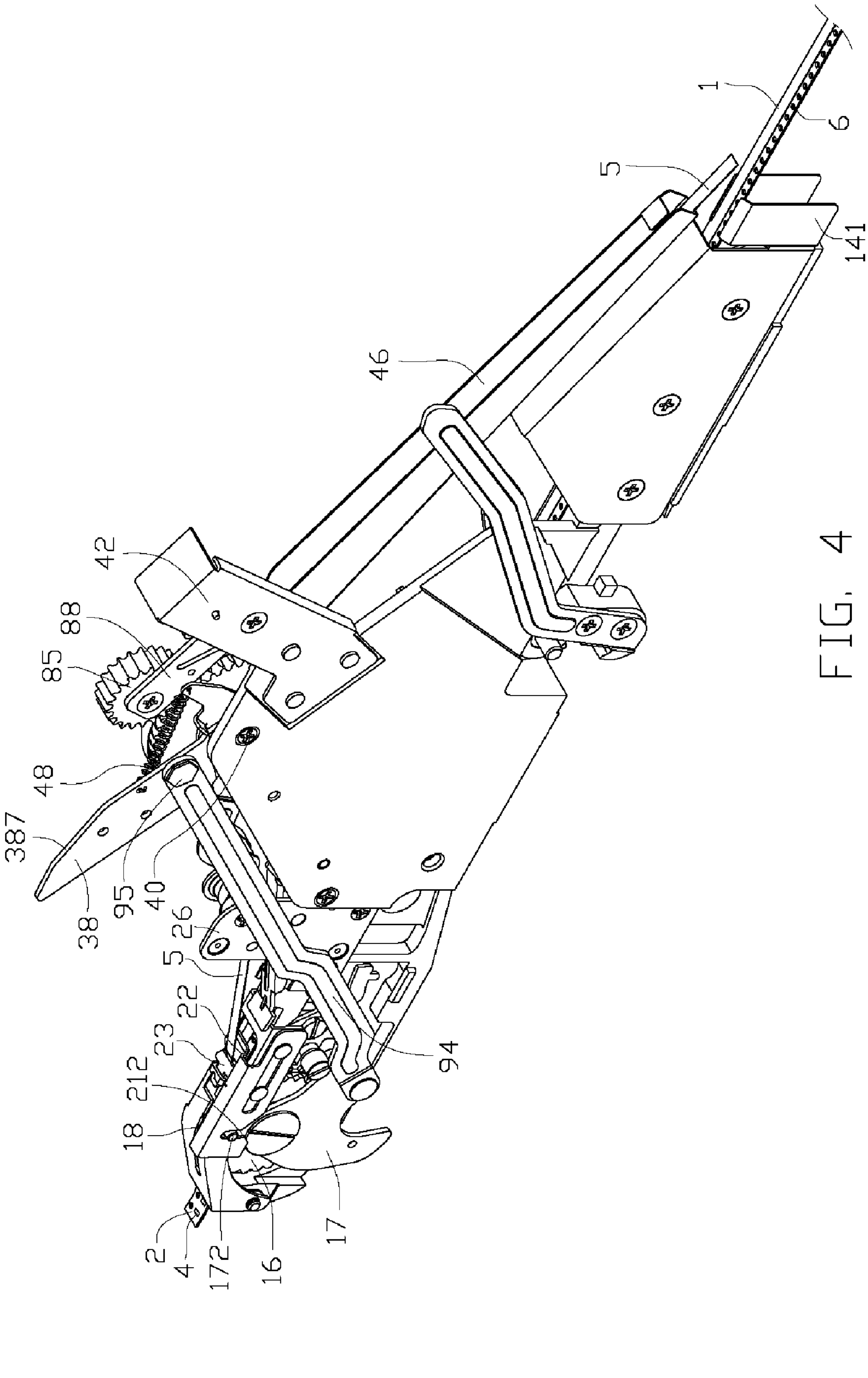
FIG. 4 is similar to FIG. 3, but viewed from another aspect.

Referring also to FIG. 4, the platform 12 includes an import end 14*a*, and an export end 14*b*. The import end 14*a* defines an entry 141 therethrough. The export end 14*b* has a shelled configuration. The export end 14*b* includes a ratchet 16, a locating gear 18 installed therein, and a slider 21 slidably attached thereon. The ratchet 16 is resiliently amounted in the export end 14*b* via a resilient member 37 and includes a leaf 17. A pin 172 extends perpendicularly from the leaf 17. The slider 21 is slidably mounted on the export end 14*b* and defines a channel 212 therein for engaging with the pin 172. A bridge 20 and a blade 23 form on a top portion of the export end 14*b*. A first exit 24 is defined in the top portion of the export end 14*b* between the bridge 20 and the blade 23. A second exit 22 is defined in a distal portion of the export end 14*b*. The locating gear 18 is for engaging in the apertures 6 of the carrier band 2. The crank bar 94 includes a first end fixed on the leaf 17, and a second end defining a through hole 942 therein for engaging with a screw 95.

Figure 7:
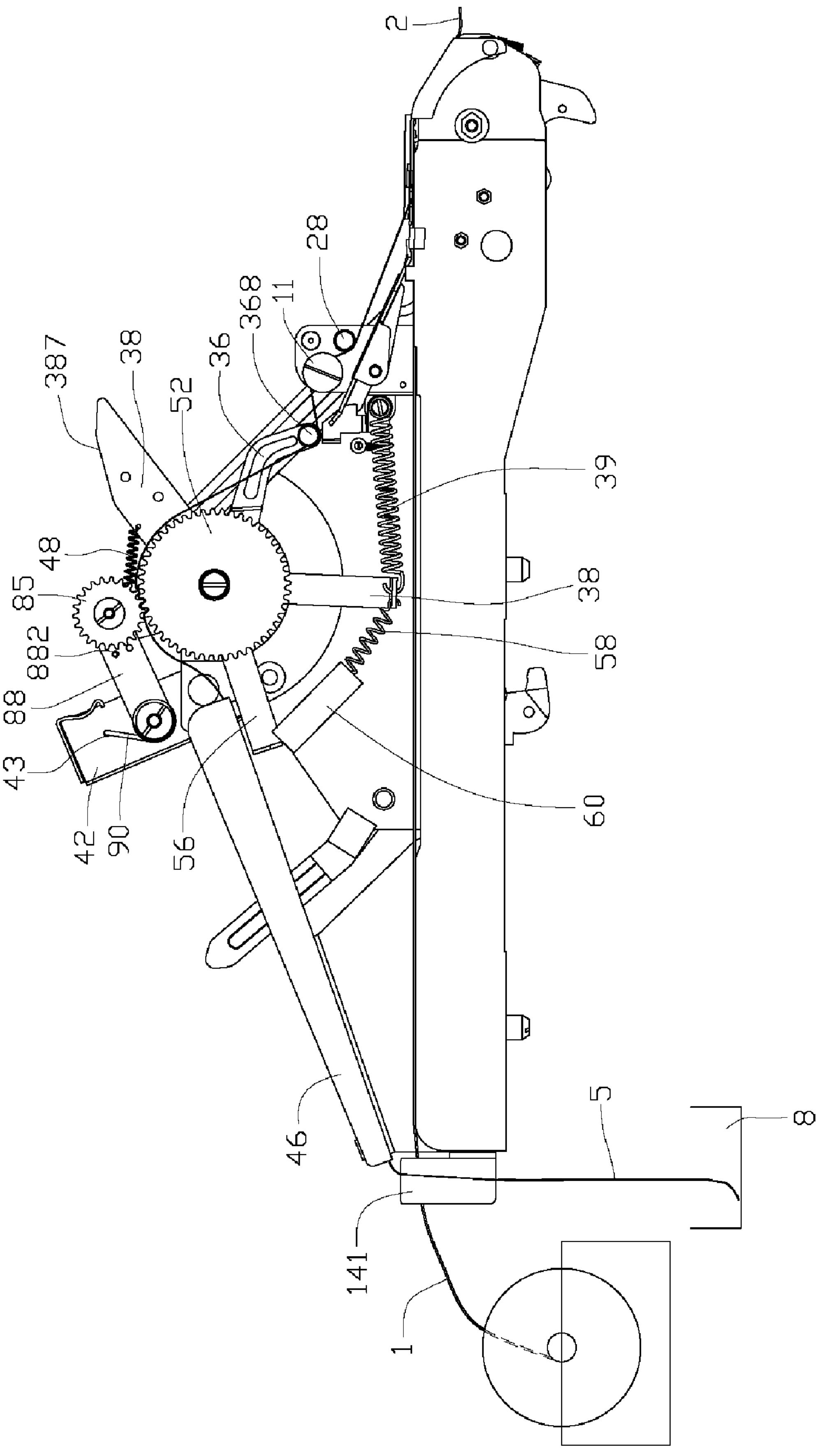
FIG. 7 is a schematic view of a working principle of the package removal device.

The main mounting board 30 includes a post 13, and a rod 15 extending perpendicularly therefrom. The second mounting board 26 includes a spindle 11, and a pole 28 extending perpendicularly therefrom. The main mounting board 30 defines a first mounting hole 32 therein. Referring also to FIG. 7, the first mounting board 42 defines an aperture 43, and a second mounting hole 44 therein.

The first scrolling unit of a driving mechanism for the package 5 includes a first gear 52, a first one-way bearing 53, a swing plate 56, a pressing plate 36, a first stud 51 defining a threaded hole therein, a relaying member 34, a driving plate 38, a bushing 60, three resilient members 39, 48, 58, and a screw 40. The relaying member 34 includes a hollow sleeve 341 extending perpendicularly therefrom. A grading hole 55 is defined in a central portion of the first gear 52. A through hole 531 is defined in the one-way bearing 53, corresponding to the grading hole 55. The swing plate 56 includes a hollow sleeve 563 extending from an end thereof, and a flange 562 extending perpendicularly from another opposite end thereof. An aperture 564 defined in the flange 562. The pressing plate 36 includes a central hole 362 defined in a middle portion thereof, a roller 368 extending from an end portion thereof, and an aperture 364 defined in another opposite end portion thereof. The driving plate 38 includes a central hole 382 defined in a general central portion thereof, a tab 388 defining a slot 389 extending perpendicularly from a bottom end thereof, a through hole 385 and an aperture 386 defined therein adjacent the central hole 382 in an upper portion thereof. A contact side 387 is formed at a top edge portion of the driving plate 38.

The second scrolling unit of the driving mechanism includes a second gear 85, a second one-way bearing 87, an urging plate 88, a second stud 86 defining a threaded hole therein, a third stud 92 defining a threaded hole therein, a torsion spring 90, a gasket 47 defining a through hole therein, and a pair of screws 41, 45. A grading hole 89 is defined in a central portion of the second gear 85. A through hole 871 is defined in the second one-way bearing 87. The urging plate 88 includes a hollow sleeve 884 extending from an end thereof, and an aperture 882 and a through hole 886 defined therein.

Referring also to FIGS. 3 and 4, the first and second scrolling units are separately assembled to the stand 10.

The screw 40 is extended through the first mounting hole 32 of the main mounting board 30, the central hole 382 of the driving plate 38, the central hole 362 of the pressing plate 36 in turn to engage in the first stud 51. The hollow sleeve 341 of the relaying member 34 is extended through the hollow sleeve 563 of the swing plate 56, the through hole 531 of the first one-way bearing 53 to engage in the grading hole 55 of the first gear 52. The resilient member 58 is extended through the bushing 60. Two free ends of the resilient member 58 engage in the aperture 564 of the swing plate 56 and the slot 389 of the driving plate 38 respectively. Two free ends of the resilient member 48 engage in the aperture 364 of the pressing plate 36 and aperture 386 of the driving plate 38 respectively. Two free ends of the resilient member 39 engage in the slot 389 of the driving plate 38 and the rod 15 of the stand 10 respectively. The screw 95 is extended through the through hole 942 of the crank bar 94 to engage in the through hole 385 of the driving plate 38.

The second one-way bearing 87 engages in the grading hole 89 of the second gear 85. The screw 41 is extended through the through hole 886 of the urging plate 88, the gasket 47, and the through hole 871 of the second one-way bearing 87 to engage in the second stud 86. The third stud 92 engages in the hollow sleeve 884 of the urging plate 88. The screw 45 is extended through the second mounting hole 44 of the first mounting board 42, and the torsion spring 90 to engage in the third stud 92. Two free fingers of the torsion spring 90 are engaged in the aperture 882 of the urging plate 88 and the aperture 43 of the first mounting board 42 (see FIG. 7).

In work, the component band 1 is feed into the package removal device via the entry 141 of the import end 14*a*. The component band 1 contacts the post 13 and creeps along the platform 12 to the export end 14*b*. The component band 1 moves below the bridge 20 and is divided into the package 5 and the carrier band 2. The carrier band 2 moves on and passes through the second exit 22, with the apertures 6 engaging with teeth of the locating gear l8. The package 5 frictionally passes the blade 23 and is propelled in a different direction with the carrier band 2 out of the first exit 24. The package 5 moves along a lower circumference of the pole 28, an upper circumference of the spindle 11, and a lower circumference of the roller 368 of the pressing plate 36 to climb to the first gear 52. The second gear 85 is pushed away from the first gear 52, and the torsion spring 90 is twisted. When the package 5 moves on a top circumference of the first gear 52, the second gear 85 is released to mesh with the first gear 52. The package 5 moves between the first gear 52 and the second gear 85 and further moves into the ditch 46.

Figure 5:
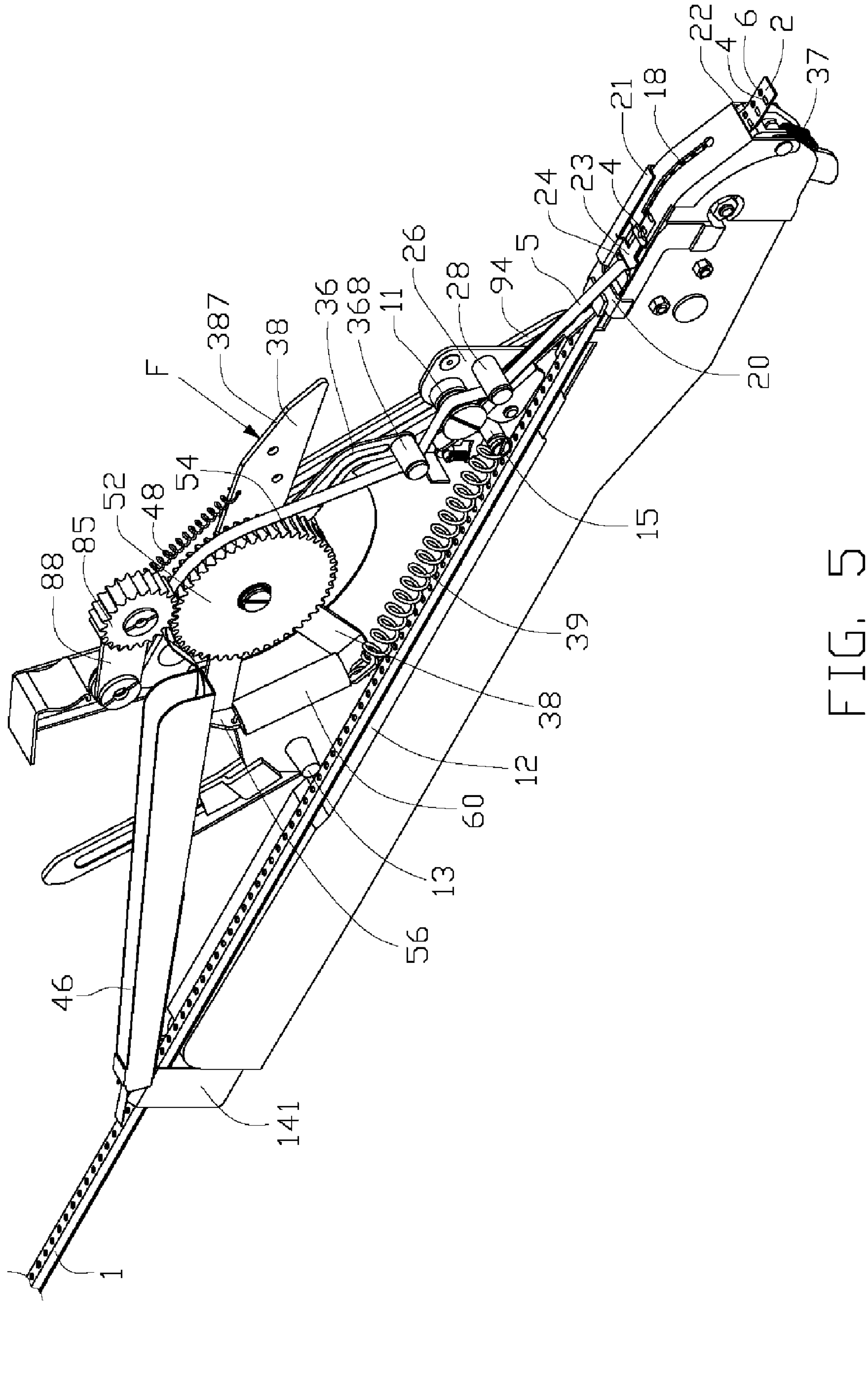
FIG. 5 is similar to FIG. 3, showing the force released from the package removal device.
Figure 6:
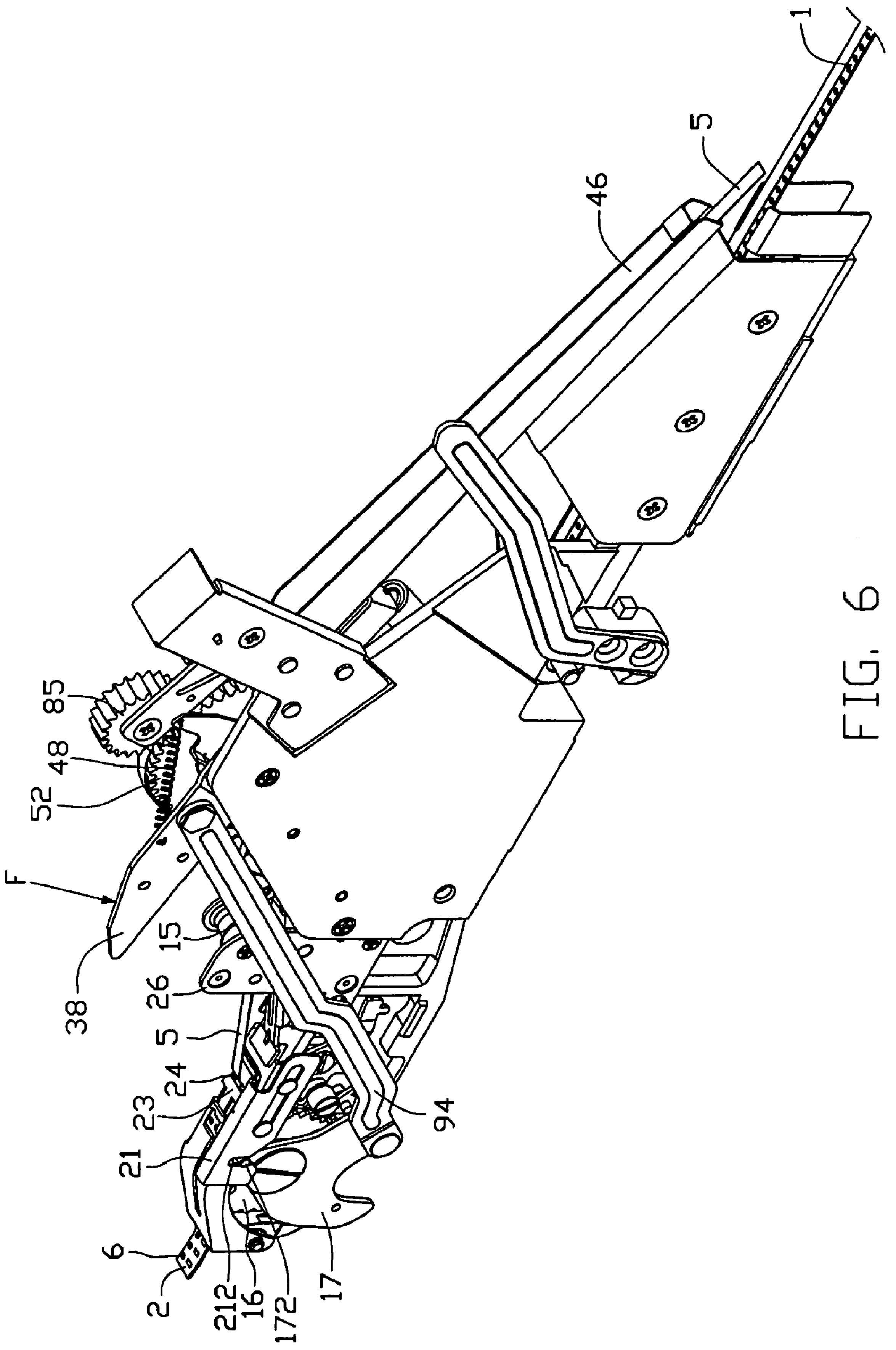
FIG. 6 is similar to FIG. 5, but viewed from another aspect.

Referring also to FIGS. 5 and 6, a force is applied to the contact side 387 of the driving plate 38 to rotate the driving plate 38 clockwise. The pressing plate 36, the bushing 60, and the swing plate 56 are accordingly rotated clockwise. The second gear 85 is moved to clockwise rotate by the resilient member 48. The crank bar 94 is accordingly moved to rotate the leaf 17. The slider 21 moves away the second exit 22, with the pin 172 of the leaf 17 sliding in the channel 212 of the slider 21. The one-way ratchet 16 and the component band 1 keep still. The package 5 is accordingly stretched by the roller 368 of the pressing plate 36 and is separated from the component band 1 by the blade 23. Thus, the electronic components 4 of the component band 1 are exposed on the carrier band 2.

Referring also to FIGS. 3, 4 and 7, when the force is released, the resilient member 39 is restored to move the driving plate 38 back, the resilient member 48 is restored to move the pressing plate 36 back, and the resilient member 58 is restored to move the swing plate 56 back. Accordingly, the first gear 52 rotates anticlockwise to mesh with the second gear 85. The package 5 is moved along the ditch 46 via the first gear 52 and the second gear 85. The package 5 falls into a collecting box 8 passing along outer surfaces of the import end 14*a*. At the same time, the crank bar 94, the slider 21, and the leaf 17 move back to their respective original positions. The locating gear 18 accordingly rotates back to move the carrier band 2 pass the second exit 22.

With the recycle of the above operations, the package 5 is moved into the stand 10 from the import end 14*a* and the carrier band 2 is attained out of the export end 14*b* continuously. Without any stops, the package 5 is removed from the component band 1 during the work. The efficiency is increased.

The first gear 52 and the second gear 85 can be replaced by other elements, such as a pair of engaging wheels with enough frictions therebetween. The first one-way bearing 53 and the second one-way bearing 87 also can respectively be replaced by another unidirectional clutch member, such as a ratchet.

It is believed that the present embodiment and its advantages will be understood from the foregoing description, and it will be apparent that various changes may be made thereto without departing from the spirit and scope of the invention or sacrificing all of its material advantages, the example hereinbefore described merely being a preferred or exemplary embodiment of the invention.

What is claimed is:

1. A package removal device for removing a package from a component band to expose a carrier band accommodating electronic components, the package removal device comprising:

- a stand comprising a platform, a main mounting board extending from the platform, the platform comprising a locating gear to engage the carrier band;
- a first scrolling unit comprising a first gear, a driving plate, and a pressing plate, the driving plate resiliently attached to the main mounting board and the pressing plate, and the first gear pivotally attached to the pressing plate; and
- a second scrolling unit comprising an urging plate, and a second gear, the urging plate resiliently connected to the driving plate, the second gear pivotally attached to the urging plate and meshing with the first gear for moving the package therebetween.

2. The package removal device as claimed in claim 1, wherein the platform further comprises an import end, and an export end, the import end comprises an entry for the component band entering therethrough, the locating gear is arranged in the export end for engaging with the carrier band.

3. The package removal device as claimed in claim 2, wherein the export end has a shell configuration and comprises a first exit defined in a top portion thereof for the package moving therethrough, and a second exit defined in a distal portion thereof for the carrier band moving therethrough.

4. The package removal device as claimed in claim 3, wherein the export end further comprises a bridge, and a blade beside the first exit, the package moves out of the first exit along the blade and the bridge.

5. The package removal device as claimed in claim 2, wherein the export end comprises a slider slidably attached thereon, and a ratchet mounted therein, the slider defines a channel therein, the locating gear is mounted on the ratchet and comprises a leaf, the leaf comprises a pin extending therefrom for engaging in the channel.

6. The package removal device as claimed in claim 2, wherein a ditch with a U-shaped configuration is disposed between the import end and the main mounting board, providing a transport passage for the package.

7. The package removal device as claimed in claim 1, wherein the main mounting board comprises a post extending therefrom upon the platform, for engaging with the component band.

8. The package removal device as claimed in claim 1, wherein a first one-way bearing engages with the first gear, and a second one-way bearing engages with the second gear.

9. The package removal device as claimed in claim 1, wherein the driving plate comprises a tab extending therefrom, the main mounting board comprises a rod extending therefrom, a resilient member is fixed with its two ends respectively fixed to the tab and the rod, a bushing is fixed around the resilient member and engages with the tab.

10. The package removal device as claimed in claim 1, wherein the main mounting board comprises a spindle, and a pole fixed thereon, the pressing plate comprises a roller extending therefrom, the package winds a lower circumference of the pole, an upper circumference of the spindle, and a lower circumference of the roller in turn.

* * * * *